United States Patent
Hung

(10) Patent No.: US 12,020,741 B2
(45) Date of Patent: Jun. 25, 2024

(54) MANAGING DATA REFRESH IN SEMICONDUCTOR DEVICES

(71) Applicant: Macronix International Co., Ltd., Hsinchu (TW)

(72) Inventor: Shuo-Nan Hung, Zhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 128 days.

(21) Appl. No.: 17/838,921

(22) Filed: Jun. 13, 2022

(65) Prior Publication Data

US 2023/0402085 A1  Dec. 14, 2023

(51) Int. Cl.
*G11C 11/40* (2006.01)
*G11C 11/406* (2006.01)
*G11C 11/4096* (2006.01)
*H03K 19/20* (2006.01)

(52) U.S. Cl.
CPC .. *G11C 11/40615* (2013.01); *G11C 11/40618* (2013.01); *G11C 11/4096* (2013.01); *H03K 19/20* (2013.01)

(58) Field of Classification Search
CPC ........ G11C 11/40615; G11C 11/40618; G11C 11/4096; H03K 19/20
See application file for complete search history.

(56) References Cited

U.S. PATENT DOCUMENTS

| 7,016,229 B2 | 3/2006 | Kim | |
| 2015/0254136 A1* | 9/2015 | Hoya | G06F 11/1012 714/764 |
| 2015/0340100 A1* | 11/2015 | Cai | G11C 11/56 365/185.03 |
| 2019/0324855 A1* | 10/2019 | Yeh | G11C 29/52 |

OTHER PUBLICATIONS

Tseng et al., "In-Memory-Searching Architecture Based on 3D-NAND Technology with Ultr-high Parallelism" IEEE International Election, 2020, 3 pages.

* cited by examiner

*Primary Examiner* — Mohammed A Bashar
(74) *Attorney, Agent, or Firm* — Fish & Richardson P.C.

(57) ABSTRACT

Methods, devices, and systems for managing data refresh for semiconductor devices are provided. In one aspect, a semiconductor device includes a memory cell array having a plurality of blocks each including multiple pages and one or more integrated circuits coupled to the memory cell array. The one or more integrated circuits are configured to: read specific data from a page of a block in the memory cell array, perform a logic operation on the specific data in the page to obtain a logic operation result, count a number of bits having a specific value among the logic operation result, determine whether the number of bits is within a data refresh criterion for the page, and in response to determining that the number of bits is outside of the data refresh criterion, generate a data refresh warning message for the page in the block.

20 Claims, 12 Drawing Sheets

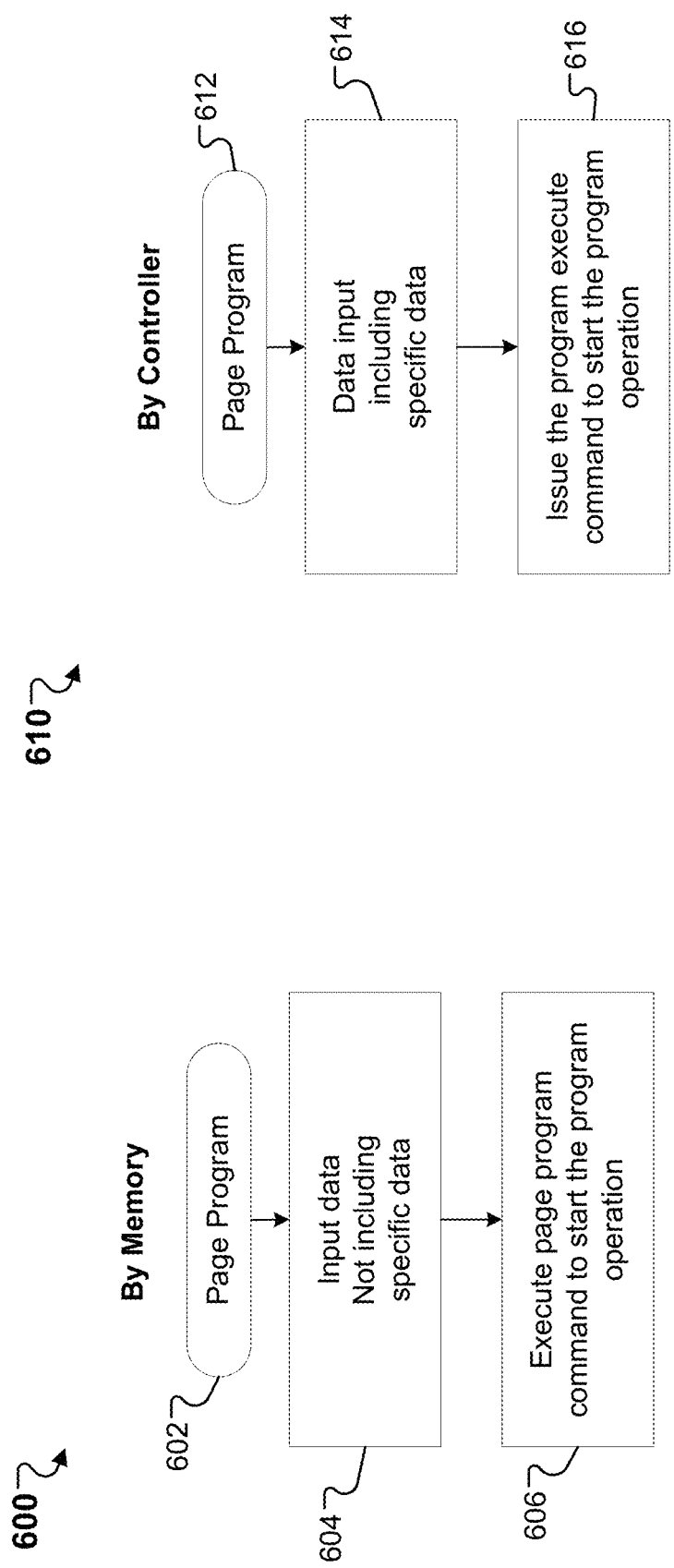

| Voltage Level | L0 | L1 | L2 | L3 | L4 | L5 | L6 | L7 |
|---|---|---|---|---|---|---|---|---|
| Low Page | 1 | 1 | 1 | 0 | 0 | 0 | 0 | 1 |
| Middle Page | 1 | 1 | 0 | 0 | 1 | 1 | 0 | 0 |
| Up Page | 1 | 0 | 0 | 0 | 0 | 1 | 1 | 1 |

FIG. 7B

| Data | 1 | 0 |
|---|---|---|
| Low Page | 69% | 31% |
| Middle Page | 50% | 50% |
| Up Page | 69% | 31% |

FIG. 7C

MANAGING DATA REFRESH IN SEMICONDUCTOR DEVICES

BACKGROUND

Once memory cells in a semiconductor device such as a data storage device are programmed, data can be read from the memory cells by sensing a programmed state of each memory cell by comparing a cell current to one or more read reference currents. However, the cell current may change due to one or more factors, such as read disturbance or data retention, which may make the sensed programming states different from the written programmed states and cause failed bits in a reading output of the data. Thus, it is desirable to detect data integrity during a lifetime of the data storage device.

SUMMARY

The present disclosure describes systems and techniques for managing data refresh in semiconductor devices, e.g., computing in memory (CIM) type non-volatile memory chips such as in memory searching (IMS) type memory chips.

One aspect of the present disclosure features a system including: a memory including a plurality of blocks, each block including multiple pages; and a controller coupled to the memory and configured to send an operation command to the memory, the operation command corresponding to one or more pages in the memory. The memory is configured to: read specific data stored in a page of the one or more pages, perform a logic operation on the specific data in the page to obtain a logic operation result, and count a number of bits having a specific value among the logic operation result, the number of bits being associated with data refresh determination for a corresponding block including the page.

In some embodiments, the memory is configured to: determine whether the number of bits is within a data refresh criterion for the page, and in response to determining that the number of bits is outside of the data refresh criterion, generate a data refresh warning message for the page in the corresponding block.

In some embodiments, the data refresh criterion includes a data refresh range from a lower data count threshold to a higher data count threshold, and the number of bits is outside of the data refresh criterion if the number of bits is smaller than the lower data count threshold or greater than the higher data count threshold, and the number of bits is within the data refresh criterion if the number of bits is no smaller than the lower data count threshold and no greater than the higher data count threshold.

In some embodiments, the memory is configured to: determine whether there is at least one other data refresh warning message generated for at least one other page in the corresponding block; and in response to determining that there is no other data refresh warning message generated for the at least one other page in the corresponding block, send the data refresh warning message and information associated with the corresponding block to the controller.

In some embodiments, the memory is configured to: in response to determining that there is at least one other data refresh warning message generated for the at least one other page in the corresponding block, disregard the data refresh warning message generated for the corresponding block.

In some embodiments, the controller is configured to: in response to receiving the data refresh warning message and the information associated with the corresponding block from the memory, record the corresponding block for data refresh.

In some embodiments, the controller is configured to perform the data refresh for the corresponding block by copying data in the corresponding block to a buffer block, recovering the copied data in the buffer block using an ECC scheme, and erasing the corresponding block and writing back the recovered data to the erased corresponding block.

In some embodiments, the memory is further configured to: in response to determining at least one of (i) the number of bits is within the data refresh criterion or (ii) there is at least one other data refresh warning message generated for at least one other page in the corresponding block, determine whether the page is a last page of the one or more pages corresponding to the operation command.

In some embodiments, the memory is further configured to: in response to determining that the page is the last page of the one or more pages corresponding the operation command, send a message to the controller, the message indicating a completion of the operation command, and in response to determining at least one of: (i) there is a second page following the page in the one or more pages or (ii) there is a resume command received from the controller, continue to read data stored in the second page for further operation.

In some embodiments, the controller is configured to: in response to determining that the page is not the last page in the one or more pages, send the resume command to the memory.

In some embodiments, the memory includes a configuration register storing the data refresh criterion for the page, and the configuration register is configured to store respective data fresh criterions for different pages in the memory.

In some embodiments, the controller is configured to set, based on the logic operation, one or more respective data refresh criterions for the one or more pages corresponding to the operation command.

In some embodiments, a block includes a plurality of pages that are associated with a same word line and include memory cells having a series of states, and among the series of states, data programmed in a first state has an inclination to suffer from more data degradation than data programmed in a second state, and the controller is configured to program, for the plurality of pages, first specific data in the first state and second specific data in the second state, and the first specific data has a higher data distribution weight than the second specific data among specific data for the plurality of pages.

In some embodiments, the data degradation includes at least one of read disturbance or data retention. In some embodiments, each programmed page in the memory stores corresponding specific data in the programmed page. In some embodiments, the specific data is stored in a predetermined area of the page, and the predetermined area includes at least one of a reserved data area in a spare data area or an additional data area in the page.

In some embodiments, the memory is configured to: read data from the page, the data including the specific data stored in a first area of the page and second data stored in a second, different area of the page, perform the logic operation on the second data to obtain a second logic operation result, count a second number of bits having a second specific value among the second logic operation result, and determine whether the second number of bits having the second specific value is no greater than a predetermined threshold. The second specific value can be "0".

In some embodiments, the operation command includes the predetermined threshold.

In some embodiments, the memory is configured to: in response to determining that the second number of bits is no greater than the predetermined threshold, send pass data information for the page to the controller, and in response to determining that the second number of bits is greater than the predetermined threshold, determine whether there is a data refresh warning message generated for the page.

In some embodiments, the controller is configured to: in response to receiving the pass data information from the memory, determine whether the page is a last page of the one or more pages corresponding to the operation command.

In some embodiments, the controller is configured to send a write command and the data including the second data and the specific data to the memory and the memory is configured to write the second data in the second area and the specific data in the first area of the page.

In some embodiments, the controller is configured to send a write command and the second data to the memory, and the memory is configured to write the second data in the second area and program the specific data in the first area of the page based on a predetermined configuration.

In some embodiments, the controller is configured to: after sending the operation command to the memory, monitor a status of the memory until the status of the memory changes from a busy state to a ready state.

In some embodiments, the memory is configured to send the number of bits to the controller, and the controller is configured to: determine whether the number of bits is within a data refresh criterion for the page, and in response to determining that the number of bits is outside of the data refresh criterion, record the corresponding block for data refresh.

In some embodiments, the memory is configured to perform the logic operation on the specific data in the page and input data corresponding to the logic operation to obtain the logic operation result, and the logic operation includes at least one of AND, NAND, OR, NOR, XOR, or XNOR, and the input data corresponding to the logic operation includes a series of "1" or a series of "0" for performing the data refresh determination on the specific data.

In some embodiments, the controller is configured to send the input data corresponding to the logic operation to the memory. In some embodiments, the operation command includes at least one of a start address or an end address corresponding to the one or more pages. In some embodiments, the specific value is "1" or "0".

Another aspect of the present disclosure features a semiconductor device including: a memory cell array having a plurality of blocks, each block including multiple pages; and one or more integrated circuits coupled to the memory cell array and configured to: read specific data from a page of a block in the memory cell array, perform a logic operation on the specific data in the page to obtain a logic operation result, count a number of bits having a specific value among the logic operation result, determine whether the number of bits is within a data refresh criterion for the page, and in response to determining that the number of bits is outside of the data refresh criterion, generate a data refresh warning message for the page in the block.

In some embodiments, the one or more integrated circuits include at least one of a page buffer circuit, a cache circuit, or a counting circuit.

In some embodiments, the semiconductor device further includes a configuration register storing the data refresh criterion for the page, and the configuration register is configured to store respective data fresh criterions for different pages in the memory.

In some embodiments, the one or more integrated circuits are configured to: read data from the page, the data including the specific data stored in a first area of the page and second data stored in a second, different area of the page, perform the logic operation on the second data to obtain a second logic operation result, count a second number of bits having a second specific value among the second logic operation result, determine whether the second number of bits having the second specific value is no greater than a predetermined threshold, and in response to determining that the second number of bits having the second specific value is greater than the predetermined threshold, determine whether the data refresh warning message is generated for the page.

A further aspect of the present disclosure features a method including: reading specific data from a page of a block in a memory; performing a logic operation on the specific data in the page to obtain a logic operation result; counting a number of bits having a specific value among the logic operation result; determining whether the number of bits is within a data refresh criterion for the page; and in response to determining that the number of bits is outside of the data refresh criterion, generating a data refresh warning message for the page in the block.

Implementations of the above techniques include methods, systems, computer program products and computer-readable media. In one example, a method can be performed by a system and the method can include the above-described actions performed by the system. In another example, one such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above-described actions.

The details of one or more disclosed implementations are set forth in the accompanying drawings and the description below. Other features, aspects, and advantages will become apparent from the description, the drawings and the claims.

BRIEF DESCRIPTION OF THE DRAWINGS

FIG. 6A shows an example process of storing specific data in a memory by the memory itself, according to one or more implementations of the present disclosure.

FIG. 6B shows an example process of storing specific data in a memory by a controller, according to one or more implementations of the present disclosure.

FIGS. 7A-7C illustrate diagrams of managing specific data for data refresh in TLC pages, including enhanced data weight distribution for critical states (FIG. 7A), example TLC pages (FIG. 7B), and data patterns for different TLC pages (FIG. 7C), according to one or more implementations of the present disclosure.

Like reference numbers and designations in the various drawings indicate like elements. It is also to be understood that the various exemplary implementations shown in the figures are merely illustrative representations and are not necessarily drawn to scale.

DETAILED DESCRIPTION

Figure 1:
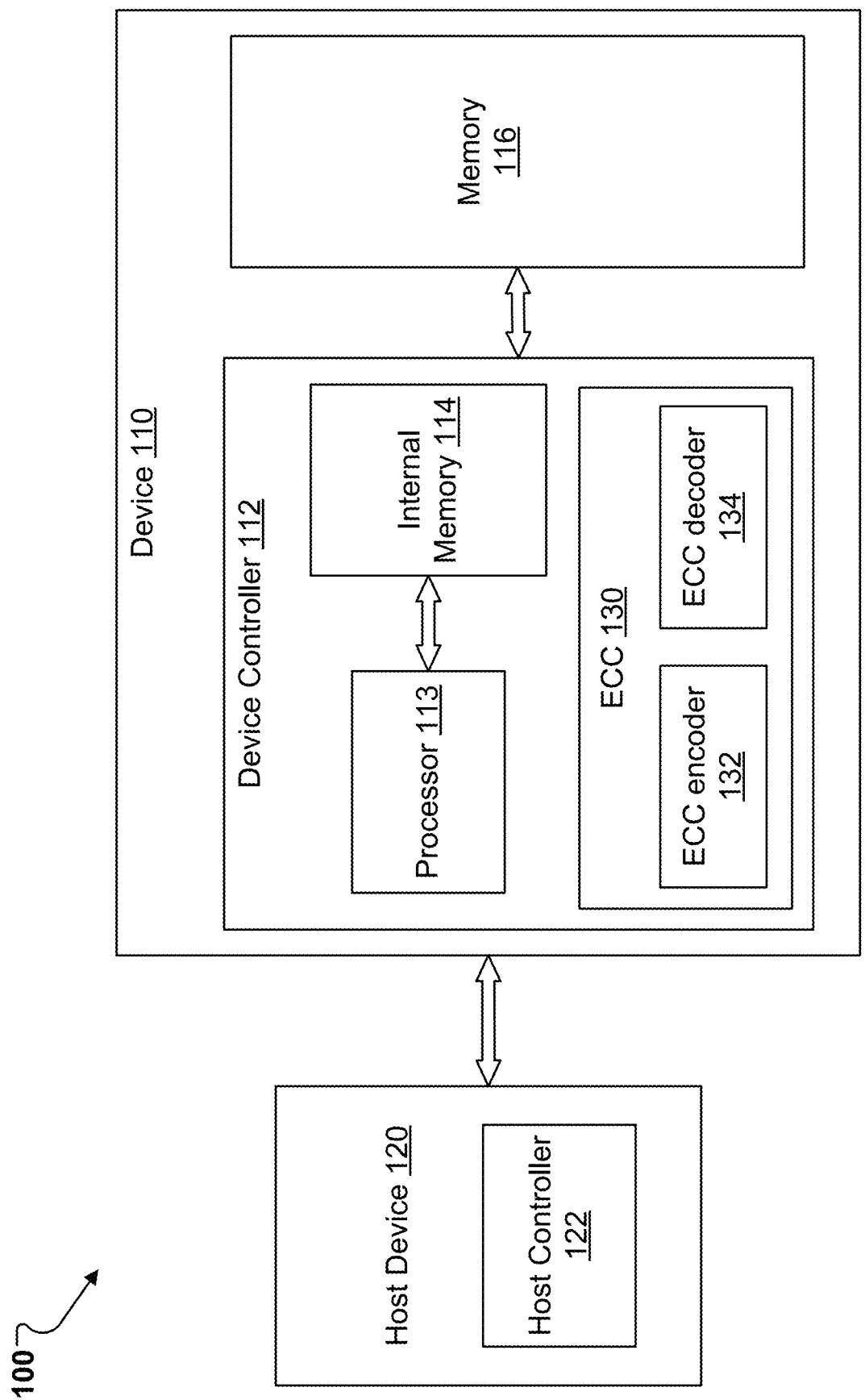
FIG. 1 illustrates an example of a system, according to one or more implementations of the present disclosure.

Due to frequent read operations, a memory may suffer from read disturbance, in which states of memory cells, e.g., an erased state and one or more programmed states, in the memory may have increased threshold voltages. Additionally, a memory may suffer from data retention, in which programmed states of memory cells may have decreased threshold voltages, e.g., due to high temperatures. The read disturbance and/or data retention may cause failed bits (or error bits) in reading the data. An error-correcting code (ECC) decoder can be configured to decode the data read from the memory to detect and correct, up to an error correction capability of an ECC scheme, any bit errors that may be present in the data.

For a computing in memory (CIM) type non-volatile memory, e.g., in a memory searching (IMS) memory, data processing is inside the memory, e.g., direct bit by bit logic operation performed in page buffers or a sensing amplifier of the memory. The data may also suffer endurance or reliability issue such as data retention or read disturbance, which can affect data integrity of the memory. However, it is difficult to use an ECC decoder (e.g., in a controller) to correct any error data. To avoid operations on pages with severe error bits or data, the controller may need to execute extra operations to monitor the data integrity of the memory and identify the error pages first.

Implementations of the present disclosure provide techniques for managing data refresh in a memory, e.g., a CIM type memory chip. The techniques integrate data integrity monitoring into CIM operations, thus controllers can save extra operations for data integrity monitoring, and the memory can have a better reliability due to no extra read for data integrity monitoring, as less read operations also cause less read disturbance.

In some implementations, specific data (e.g., a pattern composed of bits "1" and "0") is pre-stored in a specific data area (e.g., spare data area or additional data area) in a page of a memory, e.g., during a regular data writing operation on the page. Different data refresh criterions (or judgement criterions) can be set for different pages, and a controller can program more data for pages to enhance read disturbance sensitivity of data refresh detection. Then, during each CIM operation on a page, the memory can first count the number of data "1" or "0" of the specific data stored in the specific data area. The memory or the controller can compare the number of "1" or "0" to a data refresh criterion predetermined for the page. If the number of "1" or "0" is within the data refresh criterion (e.g., between a lower data count threshold and a higher data count threshold), data in the page is safe and there is no need to perform data refresh, and the CIM operation can be performed on the page. If the number of "1" or "0" is outside of (or not in) the data refresh criterion (e.g., greater than the higher data count threshold or smaller than the lower data count threshold), it indicates that data in the page has a severe integrity issue and the data may need to be refreshed. The memory can provide the judgment result and/or the counting number to the controller to take a corresponding operation, e.g., a data refresh operation.

Besides managing data refresh in a memory, the techniques can be also applied to any other suitable application, e.g., for read voltage adjustment for read retry. The techniques can be applied to various types of volatile memory or non-volatile memory, such as NAND flash memory, NOR flash memory, resistive random-access memory (RRAM), phase-change memory (PCM) such as phase-change random-access memory (PCRAM), spin-transfer torque (STT)-Magnetoresistive random-access memory (MRAM), among others. The techniques can also be applied to charge-trapping based memory, e.g., silicon-oxide-nitride-oxide-silicon (SONOS) memory, and floating-gate based memory. The techniques can be applied to two-dimensional (2D) memory or three-dimensional (3D) memory. The techniques can be applied to various memory types, such as SLC (single-level cell) devices, MLC (multi-level cell) devices like 2-level cell devices, TLC (triple-level cell) devices, QLC (quad-level cell) devices, or PLC (penta-level cell) devices. Additionally or alternatively, the techniques can be applied to various types of devices and systems, such as secure digital (SD) cards, embedded multimedia cards (eMMC), or solid-state drives (SSDs), embedded systems, among others.

FIG. 1 illustrates an example of a system 100. The system 100 includes a device 110 and a host device 120. The device 110 includes a device controller 112 and a memory 116. The device controller 112 includes a processor 113 and an internal memory 114. In some implementations, the device 110 includes a plurality of memories 116 that are coupled to the device controller 112.

The host device 120 includes a host controller 122 that can include at least one processor and at least one memory coupled to the at least one processor and storing programming instructions for execution by the at least one processor to perform one or more corresponding operations.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory is a cache memory that is included in the device controller 112, as shown in FIG. 1. The internal memory 114 stores instruction codes, which correspond to the instructions executed by the processor 113, and/or the data that are requested by the processor 113 during runtime.

The device controller 112 transfers the instruction code and/or the data from the memory 116 to the internal memory 114. The memory 116 can be a semiconductor device. In some implementations, the memory 116 is a non-volatile memory that is configured for long-term storage of instructions and/or data, e.g., a NAND flash memory, or some other suitable non-volatile memory. In implementations where the memory 116 is NAND flash memory, the device 110 is a flash memory, e.g., a flash memory card, and the device controller 112 is a NAND flash controller. For example, in some implementations, when the device 110 is an eMMC or an SD card, the memory 116 is a NAND flash; in some implementations, when the device 110 is a digital camera, the memory 116 is an SD card; and in some implementations, when the device 110 is a media player, the memory 116 is a hard disk.

In some implementations, the device controller 112 is configured to receive data and instructions from and to send data to the host device 120. The device controller 112 is further configured to send data and commands to the memory 116 and to receive data from the memory 116. For example, the device controller 112 is configured to send data and a write command to instruct the memory 116 to store the data to a specified address. As another example, the device controller 112 is configured to receive a read request (or a read command) from the host device 120 and send a corresponding read command to the memory 116 to read data from a specified address in the memory 116.

In some implementations, the device controller 112 includes an error correction code (ECC) circuit 130. The ECC circuit 130 can include an ECC encoder 132 and an ECC decoder 134. The ECC encoder 132 can be configured to receive data to be stored to the memory 116 and to generate a codeword, e.g., by encoding the data using an ECC encoding scheme. The ECC encoder 132 can include a Reed Solomon encoder, a Bose-Chaudhuri-Hocquenghem (BCH) encoder, a low-density parity check (LDPC) encoder, a Turbo Code encoder, or any combination thereof. The ECC decoder 134 can be configured to decode data read from the memory 116 to detect and correct, up to an error correction capability of the ECC scheme, any bit errors that may be present in the data. In some implementations, the ECC circuit 130 is included in the memory 116. In some implementations, the device controller 112 includes a first ECC circuit 130 and the memory 116 includes a second ECC circuit 130.

The memory 116 includes a plurality of blocks. The memory 116 can be a two-dimensional (2D) memory including 2D memory blocks. The memory 116 can also be a three-dimensional (3D) memory including 3D memory blocks. Each block can include a same number of pages. Each page has a unique number in the block. Data is stored in the pages of the block according to the order of the unique numbers of the pages in the block. Each page can be read or written separately, and pages in a block can be erased together.

In some implementations, a block can be divided into a number of sub-blocks. Each sub-block can include one or more pages. Each page in a sub-block can be read or written separately. The one or more pages in each sub-block can be erased together. In some implementations, the memory 116 includes one or more dies. Each die can be a memory chip and include a number of memory arrays and peripheral circuitry thereon. A memory array can include a number of planes, with each plane including a number of physical blocks of memory cells. Each physical block can include a number of pages of memory cells that can store a number of sectors of data. A super block can be specified, e.g., by a memory controller such as the controller 112 of FIG. 1, to combine at least one physical block from different planes. Each physical block in the super block comes from a different plane, that is, any plane cannot provide more than one block in the super block. The super block includes a number of super pages each combining multiple pages from the corresponding multiple physical blocks in the super block. Each page in a super page can have a same page number in its corresponding physical block. A super page can be programmed with all the pages in the super page being programmed simultaneously.

A memory cell can represent a number of states including an erased state and one or more programmed states. For example, in some cases, the memory cell is a single-level cell (SLC) that can store 1 bit and represent 2 states including an erased state (ER) and a programmed state (A). Memory cells in one word line can form one page. In some cases, the memory cell is a multi-level cell (MLC) such as a 2-level cell that can store 2 bits and represent 4 states including an erased state (ER) and three programmed states (A, B, and C). Memory cells in one word line can form two pages. In some cases, the memory cell is a triple-level cell (TLC) that can store 3 bits and represent 8 states including an erased state (ER) and seven programmed states (A, B, C, D, E, F, and G). Memory cells in one word line can form three pages. The states can have progressively higher voltage ranges, and the erased state can use the lowest voltage rage.

Figure 2A:
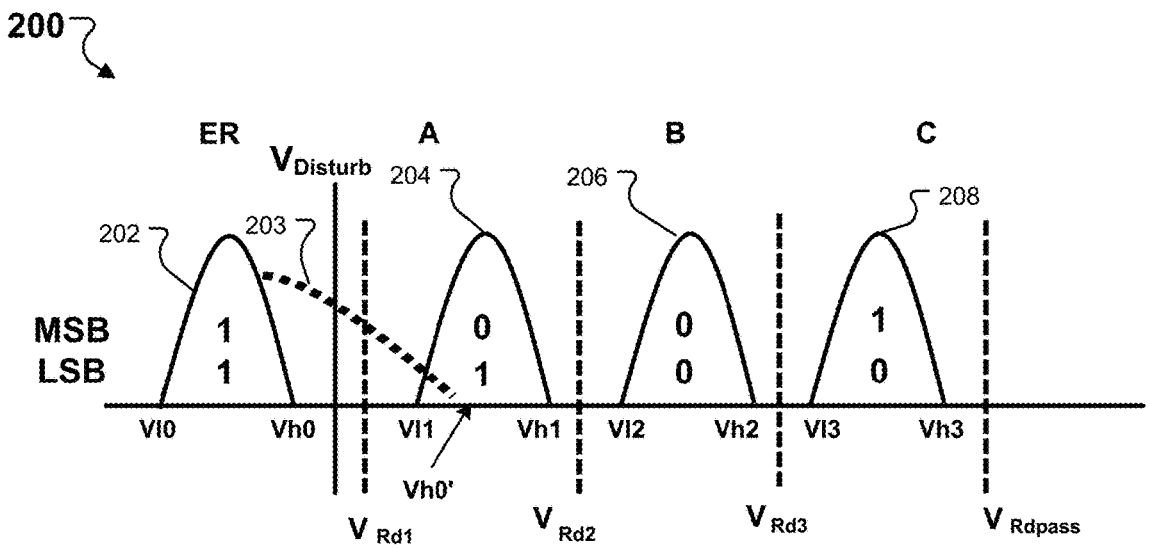
FIG. 2A illustrates an example of threshold voltage distributions of multi-level cell (MLC) memory cells for different states, according to one or more implementations of the present disclosure.

FIG. 2A illustrates an example 200 of threshold voltage distributions and read voltages for different states of a memory cell of a memory, according to one or more implementations. The memory can be the memory 116 of FIG. 1, e.g., a NAND flash memory. For illustration purposes only, the memory cell is an MLC capable of storing two-bit data.

The memory cell can be programmed or erased to have any one of four states ER, A, B, and C. In some examples, ER is an erased state (1, 1), and A, B, C are programmed states (0, 1), (0, 0), and (1, 0). The states ER, A, B and C have progressively higher read voltages. The MLC NAND flash memory can partition the two bits of each memory cell in a word line across two pages, which are the unit of data programmed at a time. The least significant bits (LSBs) of all memory cells in one word line form the LSB page of the word line, and the most significant bits (MSBs) of these cells on the word line form the MSB page of the word line.

Once programmed or erased, the memory cell has a corresponding threshold voltage. The threshold voltage is a characteristic of the memory cell. The memory cell can be a floating gate transistor. When a read voltage higher than or identical to the threshold voltage is applied to a gate of the memory cell, the memory cell can be turned on. When a read voltage lower than the threshold voltage is applied to a gate of the memory cell, the memory cell can be turned off. The read action is not a programmed or erased action and not intended to change a state of the memory cell.

Each state corresponds to a distribution of threshold voltages in a range between a lower limit voltage and a higher limit voltage. A memory cell having a threshold voltage within the range is considered to be in the corresponding state. In other words, a memory cell being in a state has a threshold voltage within the range. For example, if the memory cell has a threshold voltage between Vl0 and Vh0, the memory cell is in the state ER; if the memory cell has a threshold voltage between Vl1 and Vh1, the memory cell is in the state A; if the memory cell has a threshold voltage between Vl2 and Vh2, the memory cell is in the state B; and if the memory cell has a threshold voltage between Vl3 and Vh3, the memory cell is in the state C. Curves 202, 204, 206, 208 show threshold voltage distributions of the respective states ER, A, B, C of the memory cell, respectively.

During a read operation, a read voltage can be applied to a word line coupled to a gate of a selected memory cell to determine whether the selected memory cell is a turned-on or turned-off state. When a read voltage $V_{Rd1}$ that is larger than the threshold voltage of ER but smaller than the threshold voltage of A is applied, the memory cell is turned on when it has the state ER and turned off when it has the state A, B, or C; when a read voltage $V_{Rd2}$ that is larger than the threshold voltage of A but smaller than the threshold voltage of B is applied, the memory cell is turned on when it has the state ER or A and turned off when it has the state B or C; when a read voltage $V_{Rd3}$ that is larger than the threshold voltage of B but smaller than the threshold voltage of C is applied, the memory cell is turned on if it has the state ER, A, or B and off when it has the state C. When the read voltage $V_{Rdpass}$ that is larger than all the threshold voltages of the states ER, A, B, C is applied, the memory cell is turned on regardless of whatever state the memory cell had.

During the read operations, other memory cells in the same bit line as the selected memory cell are applied with a pass voltage $V_{Rdpass}$ and are turned on. Thus, if the selected memory cell is turned on under a read voltage $V_{Rd}$, the memory cells in the corresponding bit line form a conductive path, and there will be a current or a voltage change, which can be detected by a current or voltage sensor coupled to the bit line. If the selected memory cell is turned off under the read voltage, the memory cells in the corresponding bit line does not form a conductive path, and there is no current or no voltage change, which can be detected by a current or voltage sensor coupled to the bit line.

Due to repeated read operations, a read disturbance phenomenon may occur. In the read disturb phenomenon, a threshold voltage of the memory cell abnormally increases. As illustrated in FIG. 2A, in some cases, the distribution curve 202 for the erased state ER includes a dotted curve 203, which includes a higher threshold voltage. For example, the new higher limit voltage Vh0' is larger than the higher limit voltage Vh0. When the new higher limit voltage Vh0' is in the threshold voltage range Vl1 and Vh1 of the programmed state A, the erased state ER overlaps with the programmed state A. That is, the memory cell has overlapping states. When a read voltage, e.g., $V_{Disturb}$, is applied, the memory cell having a threshold voltage in the erased state ER becomes a turned-off state instead of a turned-on state. Thus, by detecting whether the memory cell is on or off under a specific read condition, it can be determined that whether or not the memory cell suffers from read disturbance. In some cases, memory cells being in states having lower threshold voltages, e.g., ER and A, are more susceptible to read disturbance than states having higher threshold voltages, e.g., B and C.

Figure 2B:
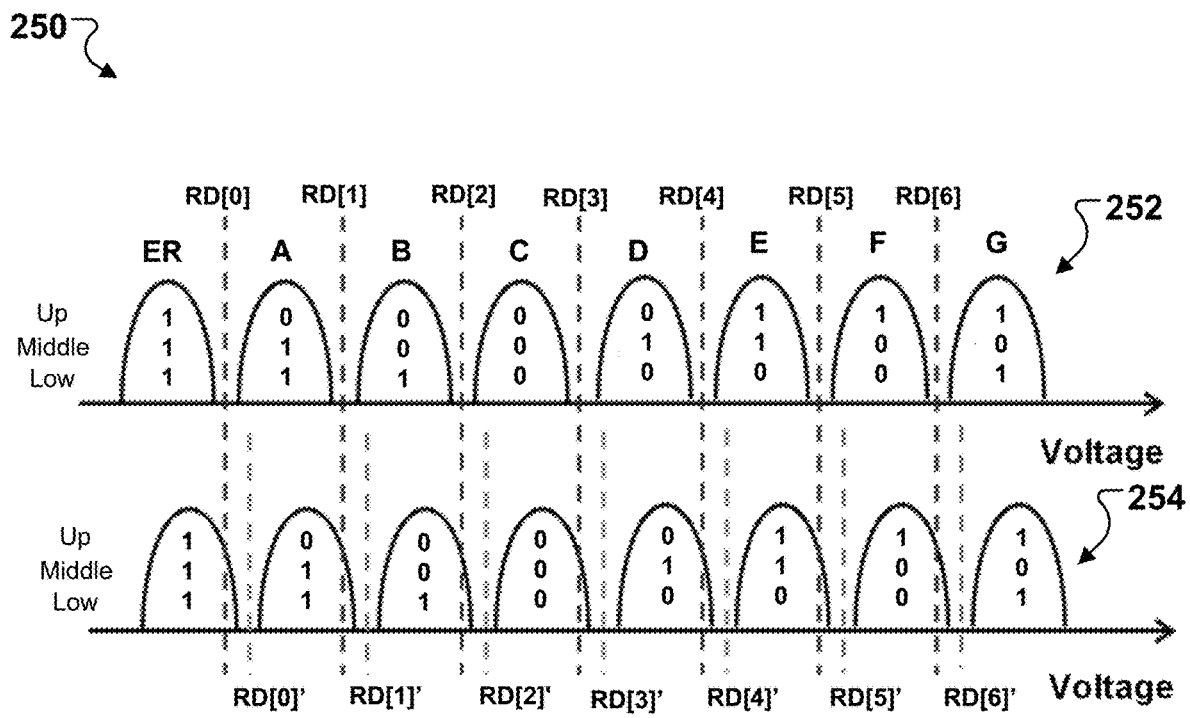
FIG. 2B illustrates an example of read voltage changes for triple-level cell (TLC) memory cells for different states, according to one or more implementations of the present disclosure.

FIG. 2B illustrates an example 250 of read voltage changes for TLC memory cells for different states, according to one or more implementations of the present disclosure. As noted above, the TLC is capable of storing three-bit data. The memory cell can be programmed or erased to have any one of eight states including an erased state (ER or L0) and seven programmed states (A, B, C, D, E, F, and G) or (L1, L2, L3, L4, L5, L6, or L7). In some examples, ER (or L0) is an erased state (1, 1, 1), and A, B, C, D, E, F, G (or L1, L2, L3, L4, L5, L6, or L7) are programmed states (1, 1, 0), (1, 0, 0), (0, 0, 0), (0, 1, 0), (0, 1, 1), (0, 0, 1), and (1, 0, 1). The eight states have progressively higher read voltages. The TLC NAND flash memory can partition the three bits of each memory cell in a word line across three pages (low page, middle page, and up page) which are the unit of data programmed at a time. Each page can include multiple chunks, e.g., 3 or 4 chunks. Each page can be read at a time. In some cases, a part of the page (e.g., one or more chunks) can be also individually read out.

Figure 9A:
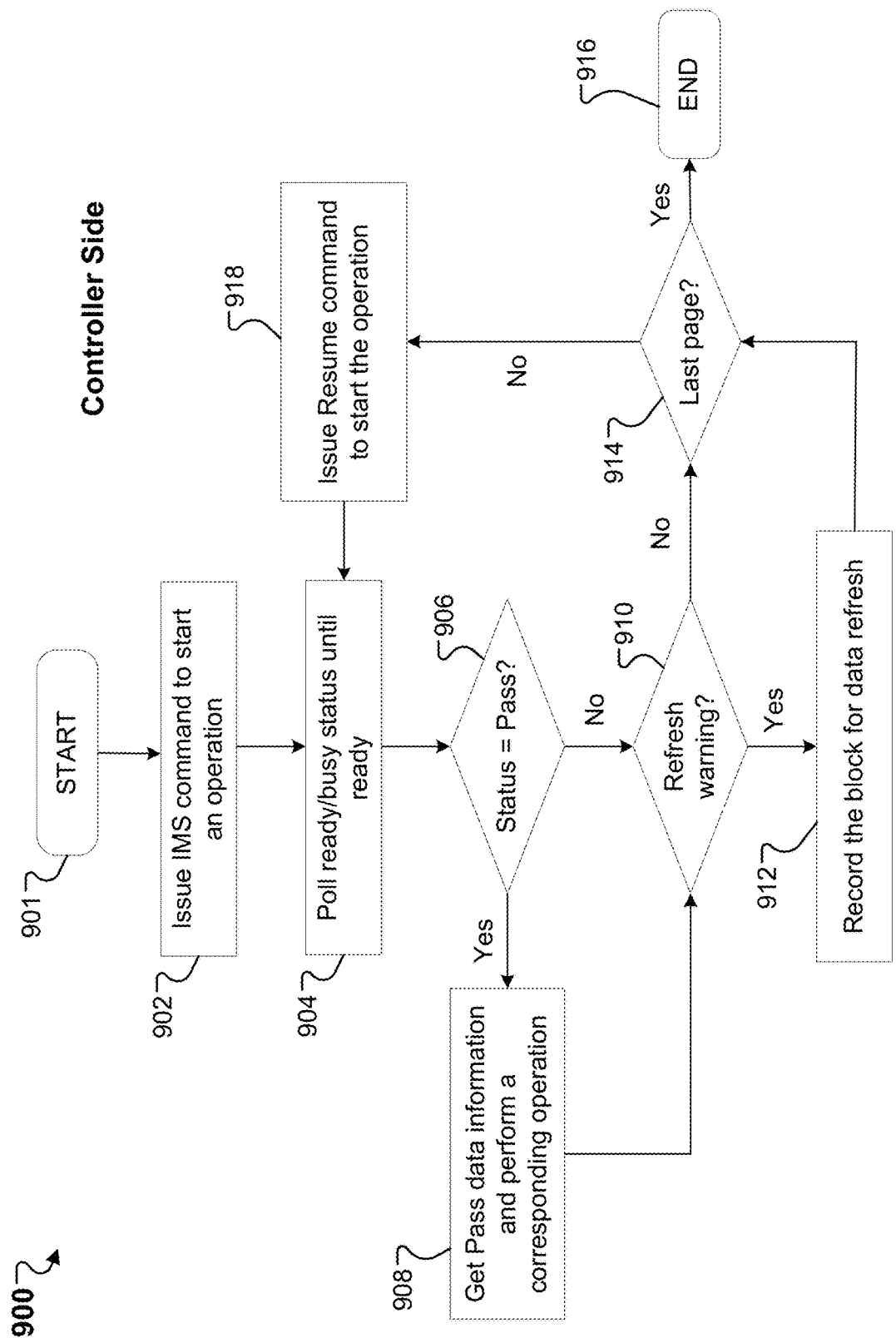
FIGS. 9A-9B are flow charts showing example processes of managing data refresh in a memory, including at a controller side (FIG. 9A) and at a memory side (FIG. 9B), according to one or more implementations of the present disclosure.

As described with further details in FIG. 9A, lower states, e.g., ER, may suffer from more read disturbance than other states, and higher states, e.g., G (or L7), may suffer from more data retention than other states. For example, as diagram 252 in FIG. 2B shows, TLC memory cells can be correctly read out using seven default read voltages RD[0], RD[1], RD[2], RD[3], RD[4], RD[5], RD[6]. There is no overlap between adjacent states, and each read voltage is between distributions of threshold voltages of the adjacent states. Due to repeated read operations, a read disturbance phenomenon may occur to the TLC memory cells, and threshold voltages of the TLC memory cells abnormally increase, as diagram 254 in FIG. 2B shows. If the TLC memory cells are still read using the seven default read voltages RD[0], RD[1], RD[2], RD[3], RD[4], RD[5], RD[6], bits stored in the TLC memory cells may be wrongly read out. To correctly read out the bits stored in the TLC memory cells, each of the default read voltages needs to be adjusted or updated to a new read voltage, e.g., RD[0]', RD[1]', RD[2]', RD[3]', RD[4]', RD[5]', RD[6]'. Otherwise, using the default read voltages to read the stored bits in the TLC memory cells may cause error bits. However, if one or more pages in a block suffer from severe data integrity issues like read disturbance or data intention, the block may need to be refreshed.

As noted above, implementations of the present disclosure provide techniques for managing data refresh in semiconductor devices, e.g., CIM type memory chips such as IMS memory chips. The techniques can integrate monitoring data integrity of a memory into CIM operations, e.g., by the memory itself determining whether a page or a block needs to be refreshed and reporting to a controller for data refresh.

Figure 3:
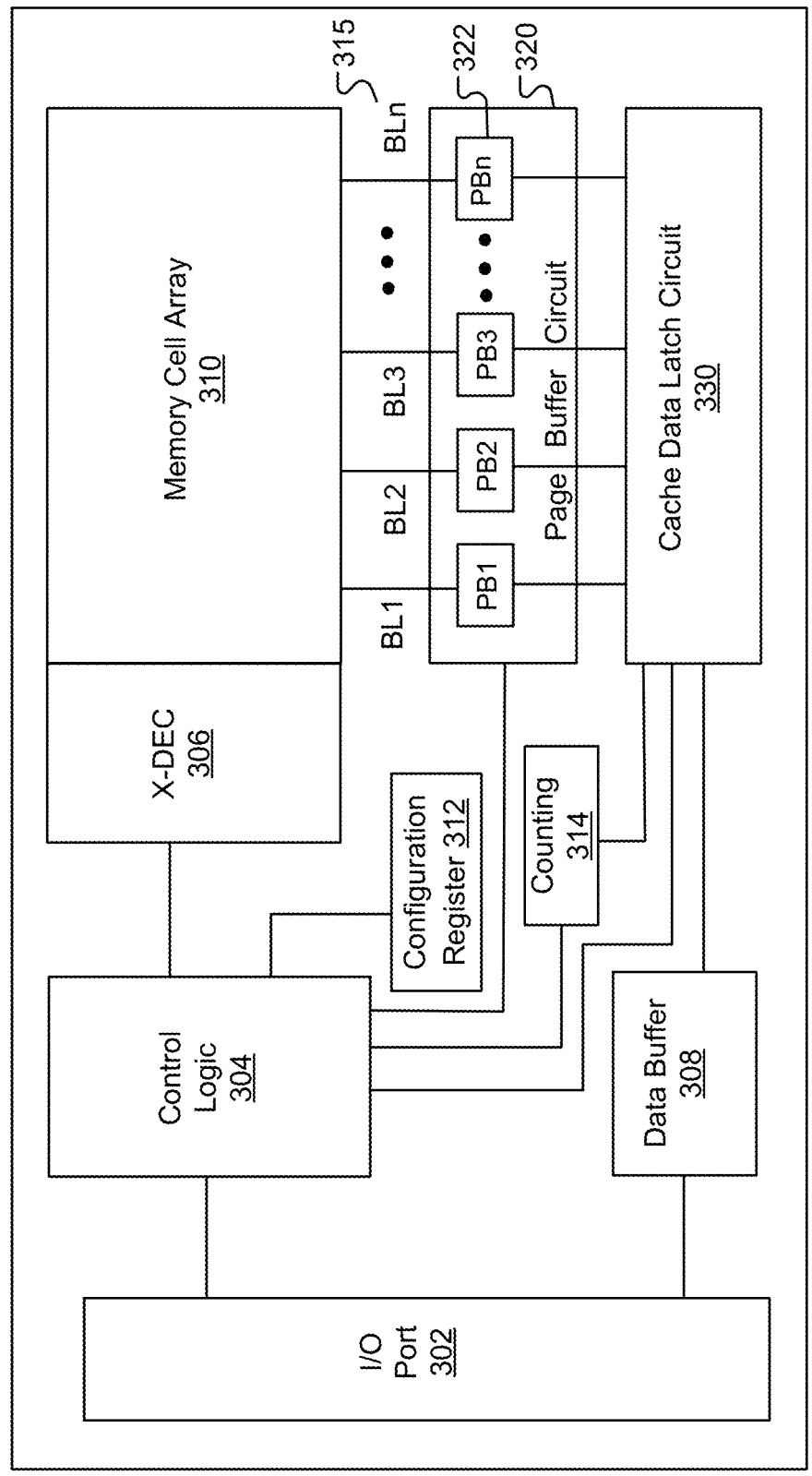
FIG. 3 illustrates an example of a memory for data refresh management, according to one or more implementations of the present disclosure.

FIG. 3 illustrates an example configuration of a memory 300. The memory 300 can be implemented as the memory 116 of FIG. 1. The memory 300 can be coupled to a controller, e.g., the device controller 112 or the host controller 122 of FIG. 1. The memory 300 is configured to perform CIM type commands (e.g., IMS type commands) from the controller. Particularly, the memory 300 can monitor data integrity in stored data, which can be integrated with executing the CIM type commands, and can report to the controller for data refresh. For example, the memory 300 can perform a logic operation on specific data stored in a page of a block in the memory 300, count a number of bits having a specific value in a logic operation result, and/or determine whether to generate a data refresh warning message for the page or the block based on the number of bits.

In some implementations, as illustrated in FIG. 3, the memory 300 includes a memory interface (I/O port) 302, a control logic 304, an X-decoder 306, a data buffer 308, a memory cell array 310, a configuration register 312, a counting circuit 314, bit lines 315, a page buffer circuit 320, and a cache data latch circuit 330.

The memory cell array 310 can include a number of memory cells coupled in series to a number of row word lines and a number of column bit lines. A memory cell can include a memory transistor configured as a storage element. The memory transistor can include a silicon-oxide-nitride-oxide-silicon (SONOS) transistor, a floating gate transistor, a nitride read only memory (NROM) transistor, or any suitable non-volatile memory MOS device that can store charges.

The memory interface 302 can include multiple input/output (I/O) ports for receiving data, e.g., from the controller, or outputting data from the memory cell array 310. The data buffer 308 can be configured to buffer data received and outputted through the memory interface 302.

The memory 300 can include the X-decoder (or row decoder) 306. Each memory cell is coupled to the X-decoder 306 via a respective word line. Accordingly, each memory cell can be selected by the X-decoder 306 for read or write operations through the respective word line.

A page buffer is configured to control a voltage on a corresponding bit line to perform an operation, e.g., read, program, or erase, on a memory cell coupled to the corresponding bit line. The page buffer circuit 320 can include a number of page buffers 322. Each page buffer 322 (PB1, PB2, PB3, . . . , PBn) can be connected to the memory cell array 310 through a respective bit line 315 (BL1, BL2, BL3, . . . , BLn). A page buffer can include one or more latches and/or logic gates for at least one logic operation. In some embodiments, a page buffer 322 is connected to a corresponding bit line 315 that connects a corresponding line of memory cells in the memory cell array 310.

In some embodiments, the memory 300 further includes the cache data latch (CDL) circuit 330 coupled between the page buffer circuit 320 and the data buffer 308. During a program operation, the CDL circuit 330 is configured to store data from the data buffer 308 and/or output to one or more page buffers 322 in the page buffer circuit 320. During a read operation, the CDL circuit 330 is configured to store data from one or more page buffers 322 in the page buffer circuit 320 and/or output data to the data buffer 308.

The control logic 304 is coupled to components in the memory 300 including the X-decoder 306, the data buffer 308, the page buffer circuit 320, the CDL circuit 330, the configuration register 312, and the counting circuit 314. The control logic 304 is configured to receive a command, address information, and/or data, e.g., from the controller, via the memory interface 302. The control logic 304 can also process the command, the address information, and/or the data, for example, to generate physical address information, e.g., of blocks/pages, in the memory cell array 310. In some embodiments, the counting circuit 314 can be included in the cache data latch circuit 330 or in the control logic 304.

In some implementations, the control logic 304 includes a data register, an SRAM buffer, an address generator, a mode logic, and a state machine. The mode logic can be configured to determine whether there is a read or write operation and provide a result of the determination to the state machine.

During a write operation, the data register in the control logic 304 can register input data from the interface 302, and the address generator in the control logic 304 can generate corresponding physical addresses to store the input data in specified memory cells of the memory cell array 310. The address generator can be connected the X-decoder 306 and the page buffer 322 that are controlled to select the specified memory cells through corresponding word lines and bit lines. The SRAM buffer can retain the input data from the data register in its memory as long as power is being supplied. The state machine can process a write signal from the SRAM buffer and provide a control signal to a voltage generator that can provide a write voltage to the X-decoder 306 and the page buffer 322. The page buffer 322 is configured to output the write voltage to the bit lines (BLs) for storing the input data in the specified memory cells.

During a read operation, the state machine can provide control signals to the voltage generator and the page buffer circuit 320. The voltage generator can provide a read voltage to the X-decoder 306 and the page buffer 322 for selecting a memory cell. A page buffer 322 can sense a small power signal (e.g., a current signal) that represents a data bit ("1" or "0") stored in the selected memory cell through a bit line 315 coupled to the page buffer 322 and the selected memory cell. A sense amplifier can amplify the small power signal swing to recognizable logic levels so the data bit can be interpreted properly by logic inside or outside the memory 300. In some implementations, the page buffer circuit 320 and/or the CDL circuit 330 are included in the sense amplifier. The data buffer 308 can receive the amplified voltage from the sensor amplifier and output the amplified power signal to the logic outside the memory 300 through the memory interface 302.

In some implementations, the memory 300 is a CIM type memory chip such as an IMS memory chip. For example, the memory 300 can receive an IMS command from the controller to execute a data searching operation. In the operation, the controller can issue the IMS command with a searching criterion to search candidate data stored in the memory cell array 310. The memory 300 can search a data segment (such as a page) that meets the searching criterion, e.g., by performing a logic operation for matching. The memory 300 can stop if the data is found and send out the information for the controller to take action. Then the controller can issue a resume command to continue the searching if necessary.

To integrate data integrity monitoring with a CIM command, specific data (or known data) for a page can be pre-stored or pre-programmed in the memory cell array 310, e.g., in the page. The specific data can include a first number of bits having a value of "1" and a second number of bits having a value of "0". The specific data can have a specific data pattern. To monitor the data integrity issue for a block, specific data can be stored in each page in the block, or each programmed page in the block, or selected pages in the block. The specific data can be programmed in a page, together with main data (e.g., normal data, host data, or user data) associated with the CIM command. Thus, no extra program operation is needed.

Figure 4:
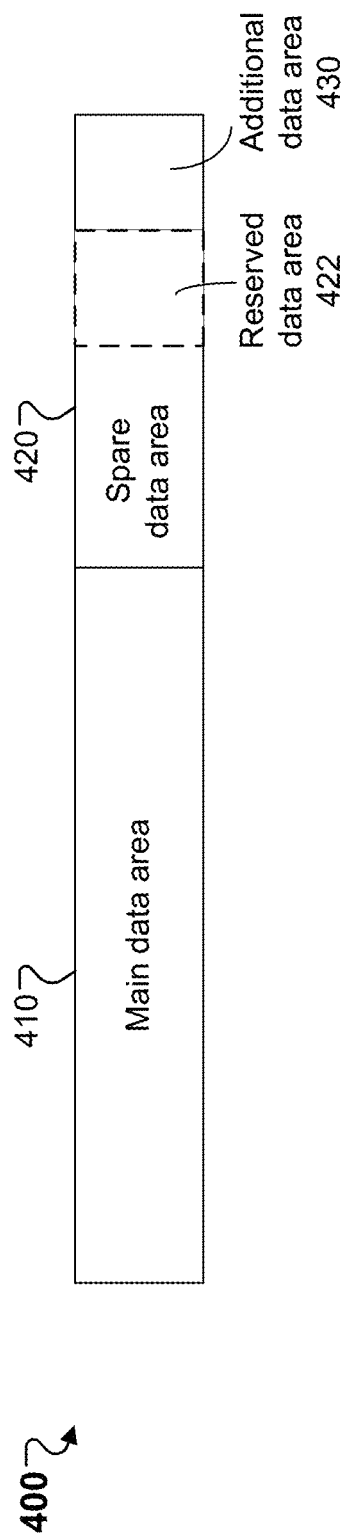
FIG. 4 illustrates an example page including different areas for storing different types of data, according to one or more implementations of the present disclosure.

FIG. 4 illustrates an example page 400 including different areas for storing different types of data, according to one or more implementations of the present disclosure. The page 400 can include a main data area 410, a spare data area 420, and an additional data area 430. Main data associated with a command (e.g., from a controller such as the device controller 112 or the host controller 122 of FIG. 1) can be stored or programmed in the main data area 410. Specific data used for data refresh detection (or data refresh determination) can be stored in a reserved data area 422 in the spare data area 420. The reserved data area 422 for storing the specific data can be predetermined or initialized, e.g., during or after manufacturing, in a memory (e.g., the memory 116 of FIG. 1 or the memory 300 of FIG. 3). The main data cannot be stored or programmed in the reserved data area 422. In some embodiments, the reserved data area 422 is in the additional data area 430.

In some examples, the main data area 410, the spare data area 420, and the additional data area 430 can have a capacity of storing 16 KB data, 2 KB data, or 1 KB data, respectively. The reserved data area 422 can have a capacity of storing 128 B (or 1024 b) data, where B is byte and b is bit.

As discussed with further details below, for data refresh detection or determination, a number of bits having a specific value, e.g., "1", within specific data stored in a page can be read out from the page and counted, e.g., by the counting circuit 314 of FIG. 3. Then the number of bits having the specific value can be compared with a data refresh criterion. If the number of bits having the specific value is within the data refresh criterion, the page is safe and there is no need for data refresh. If the number of bits having the specific value is outside of the data refresh criterion, it indicates that the page suffers from severe data integrity issues and the page (and the block including the page) needs to be refreshed. The memory can accordingly generate a data refresh warning message for the page or the block, which can be sent to the controller.

Figure 5:
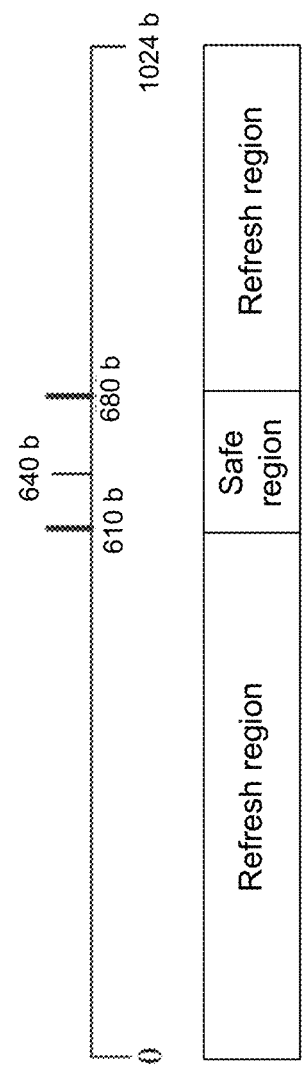
FIG. 5 illustrates an example data refresh criterion for a page in a memory, according to one or more implementations of the present disclosure.

For example, as illustrated in FIG. 5, specific data has a size of 128 B (or 1024 b), and an original number of bits having a specific value "1" of the specific data in the specific data area is 640 b. For data refresh detection, a data refresh criterion can be defined by a higher data count threshold, e.g., 680 b, and a lower data count threshold, e.g., 610 b. If the number of bits having the specific value "1" read from the page, e.g., together with a CIM command from the controller, is within the data refresh criterion of [610 b, 680 b], the page is safe. If the number of bits having the specific value "1" read from the page is outside of the data refresh criterion, e.g., smaller than the low data count threshold 610 b or higher than the high data count threshold 680 b, the page is unsafe and needs to be refreshed. If a loose data refresh criterion, e.g., having a larger range (such as from 550 b to 740 b), is chosen for data refresh, the memory can have a longer reliability. In contrary, if a tight data refresh criterion, e.g., having a smaller range (such as from 630 b to 660 b), the memory can have a shorter reliability.

Specific data for a page in a memory can be provided and written into the memory by the memory itself, e.g., as illustrated in FIG. 6A. In an example process 600, the memory receives a page program command from a controller (step 602). The memory receives input data from the controller, which does not include specific data for the page (step 604). Instead, the memory prepares specific data with a predetermined data pattern and/or a predetermined data refresh criterion. The specific data and/or the data refresh criterion can be same for multiple pages or all pages in the block. The specific data and/or the data refresh criterion can be stored in the memory, e.g., in the configuration register 312 of FIG. 3. Then the memory executes the page program command to program the input data and the specific data (step 606).

When the specific data for the page is provided by the memory, there is no extra operation for the controller to provide the specific data. Accordingly, the execution speed of the memory can be increased. Meanwhile, the specific data provided by the memory can also provide a reasonable sensitivity for data refresh detection or determination.

Specific data for a page in a memory can be provided and written into the memory by a controller, as illustrated in FIG. 6B. In an example process 610, the controller sends a page program command to the memory (step 612). The controller also sends input data including specific data for the page to the memory (step 614). Then the controller issues a programming execution command to start the page program operation (step 616).

When the specific data for the page is provided by the controller, the controller can determine different specific data for different pages in a block and/or different data refresh criterions for different pages in the block, which can satisfy different needs of users. The different data refresh criterions for the different pages can be stored in the memory, e.g., in the configuration register 312 of FIG. 3. The controller can set or adjust a data refresh criterion for a specific page in the memory. For example, the controller can increase a ratio for data having a value (e.g., "1") that is counted for data refresh detection for a page storing more important data (or suffering from more read disturbance or data retention) than one or more other pages. In such a way, the sensitivity of data refresh detection can be increased.

In some embodiments, at least one data refresh criterion (defined by lower and higher data count thresholds) is provided and a user can choose different data refresh criterions based on applications. For example, for a SLC memory, a data refresh criterion can be provided. In some cases, specific data can have a data pattern with half data "0" and half data "1". In some cases, a controller can increase the data "1" ratio (e.g., with 70% data "1" and 30% data "0" pattern) to enhance the read disturbance sensitivity, e.g., for intensive read operations.

Figure 7A:
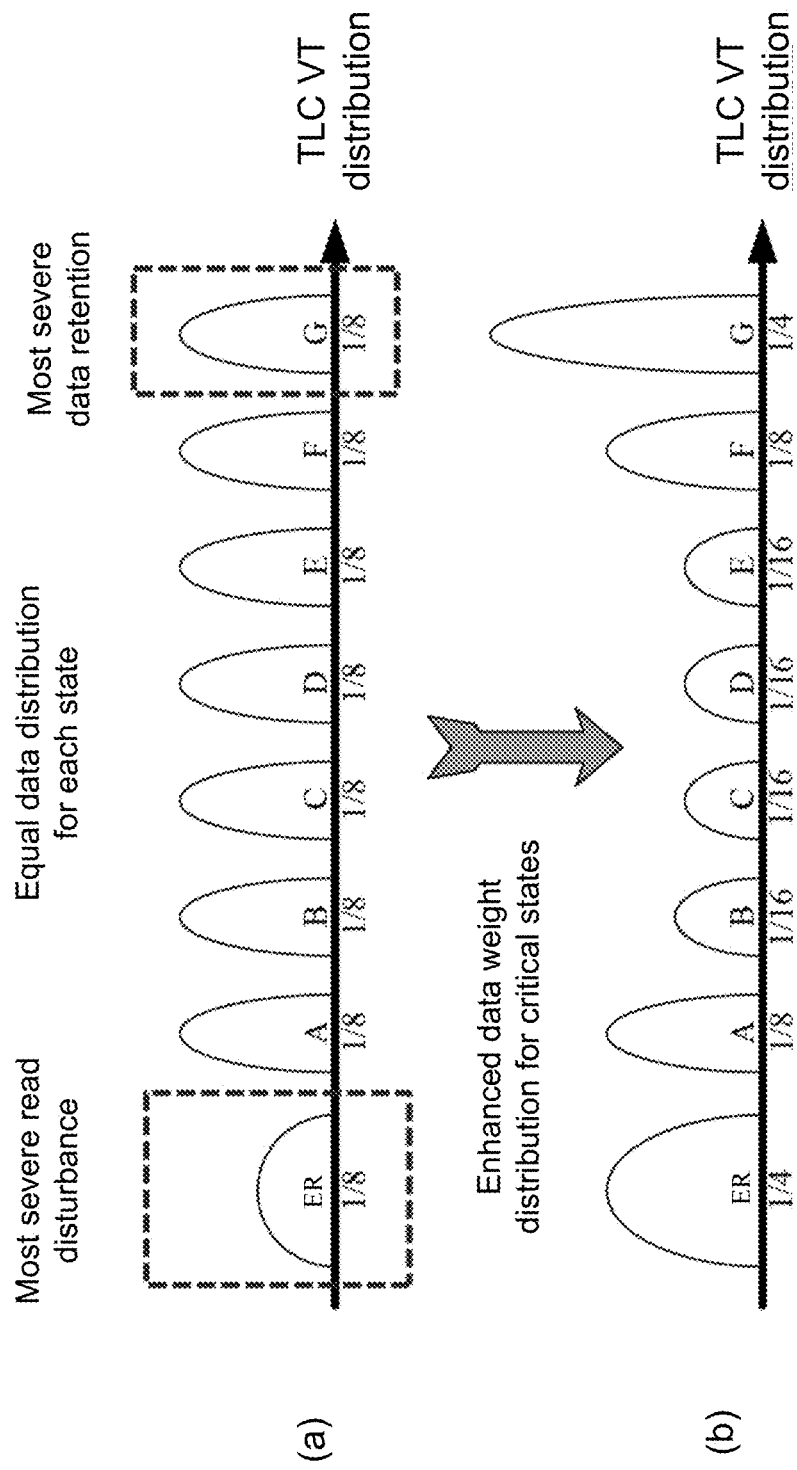

As another example, FIGS. 7A-7C illustrate diagrams of managing specific data for data refresh in a TLC memory, including enhanced data weight distribution for critical states (FIG. 7A), example TLC pages (FIG. 7B), and data patterns for different TLC pages (FIG. 7C), according to one or more implementations of the present disclosure.

As shown in FIG. 7B (and also illustrated in FIG. 2B), three TLC pages (low page, middle page, and up page) are associated with a word line in the TLC memory. Different voltage threshold (VT) states ER, A, B, C, D, E, F, G correspond to different voltage levels L0, L1, L2, L3, L4, L5, L6, L7. In the three TLC pages, each VT state or voltage level can be programmed into a respective data pattern, e.g., (1, 1, 1) for L0, (1, 1, 0) for L1, (1, 0, 0) for L2, (0, 0, 0) for L3, (0, 1, 0) for L4, (0, 1, 1) for L5, (0, 0, 1) for L6, and (1, 0, 1) for L7.

As illustrated in diagram (a) of FIG. 7A, in the TLC memory, the highest VT state (G) suffers the most severe data retention impact and the lowest VT state (ER) suffers the most severe read disturbance impact. If specific data for all the VT states are equal, e.g., each having a ratio 1/8 of the total specific data, a data refresh detection sensitivity on the highest VT state (G) and the lowest VT state (ER) can be lower than a data refresh detection sensitivity on other states (A, B, C, D, E, F).

To have a uniform sensitivity on all or most VT states, enhanced data weight distribution can be made for critical states. For example, as illustrated in diagram (b) of FIG. 7A, for the three TLC pages, the ratios of the specific data for different voltage levels are 1/4 for L0, 1/8 for L1, 1/16 for L2, L3, L4, L5, 1/8 for L6, and 1/4 for L7.

To enhance the data refresh detection sensitivity, more than one set of data patterns and/or data refresh criterions can be provided for different pages. For example, as illustrated in FIG. 7C, based on the enhanced data weight distributions shown in diagram (b) of FIG. 7A and TLC data definition in FIG. 7B, a data pattern with 69% data "1" and 31% data "0" can be provided for low and up pages, and a data pattern with 50% data "1" and 50% data "0" can be provided for the middle page. For example, for the low page, the percentage of data "1" is a sum of 1/4 (L0), 1/8 (L1), 1/16 (L2), and 1/4 (L7); for the middle page, the percentage of data "1" is a sum of 1/4 (L0), 1/8 (L1), 1/16 (L4), and 1/16 (L5); for the up page, the percentage of data "1" is a sum of 1/4 (L0), 1/16 (L5), 1/8 (L6), and 1/4 (L7). The controller can program more data for the higher state (e.g., L7) and the lower state (e.g., L0) to enhance the sensitivity for the data refresh detection. Accordingly, the controller can set different data refresh criterions for specific data stored in the different pages including the different states.

Figures 8A, 8B:
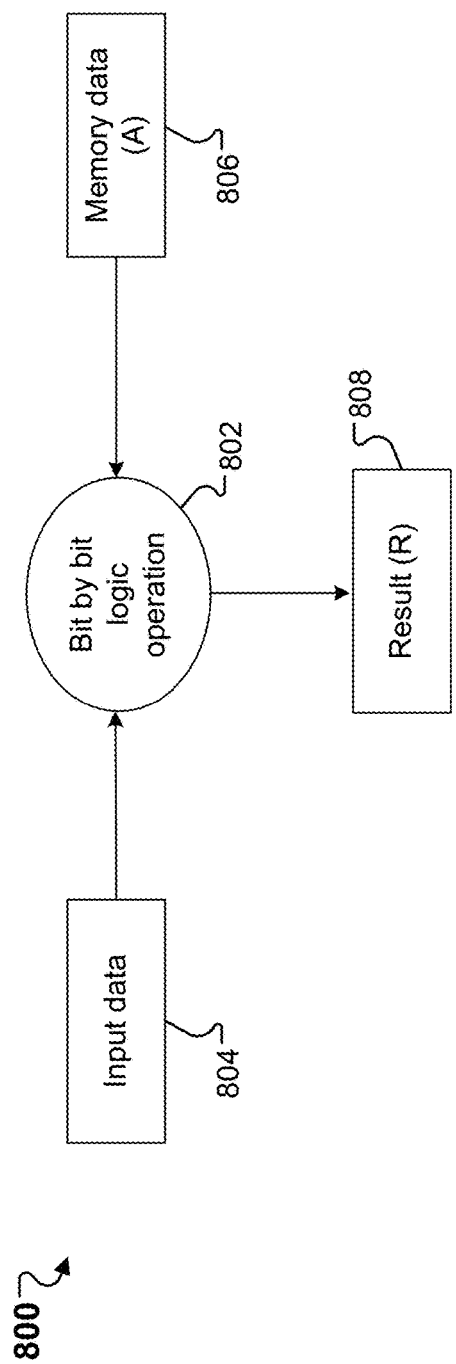
FIG. 8A illustrates an example process of logic operation, according to one or more implementations of the present disclosure.
FIG. 8B illustrates examples of different logic operations, according to one or more implementations of the present disclosure.

In a CIM operation (e.g., IMS operation), at least one logic operation (e.g., bit by bit) is performed in a memory. FIG. 8A illustrates an example process 800 of performing a logic operation 802, according to one or more implementations of the present disclosure. A controller sends input data 804 in the memory. The input data 804 can be transferred, e.g., bit by bit, into a latch of a page buffer. The memory reads memory data (A), e.g., bit by bit, into another latch of the page buffer. Then the logic operation 802 can be performed based on the input data 804 and the memory data 806 to generate a logic operation result (R) 808. The logic operation 802 can be performed by logic (e.g., logic gates) in the page buffer. Information of the logic operation 802 can be stored in the memory, e.g., in the configuration register 312 of FIG. 3, by the controller.

FIG. 8B is a table 810 illustrating a list of different logic operations, according to one or more implementations of the present disclosure. The logic operations can include AND, NAND, OR, NOR, XOR, and XNOR. As different logic operations can generate different relationships between the memory data (A) and the logic operation result (R), to ensure data refresh detection proceed correctly, corresponding input data for specific data can be determined based on a property of the logic operation.

For example, if AND bit by bit logic operation is proceeded, the corresponding input data for the specific data is "1". In such a way, the result (R) is identical to the specific data (A) and has the same data polarity as the specific data (A). In another example, if NAND bit by bit logic operation is proceeded, the corresponding input data for the specific data is still "1", and the data refresh criterion for the specific data can be different due to inverse data polarity between the result (R) and the specific data (A), where "~A" represents an inverse of data "A".

In some embodiments, one or more logic operations for a CIM operation can be stored in the memory, e.g., in the configuration register 312 of FIG. 3. For a logic operation, corresponding input data for specific data can be also stored in the memory, e.g., in the configuration register 312 of FIG. 3. When the memory performs the logic operation, the corresponding input data can be read from the configuration register and stored in a page buffer.

Figure 9B:
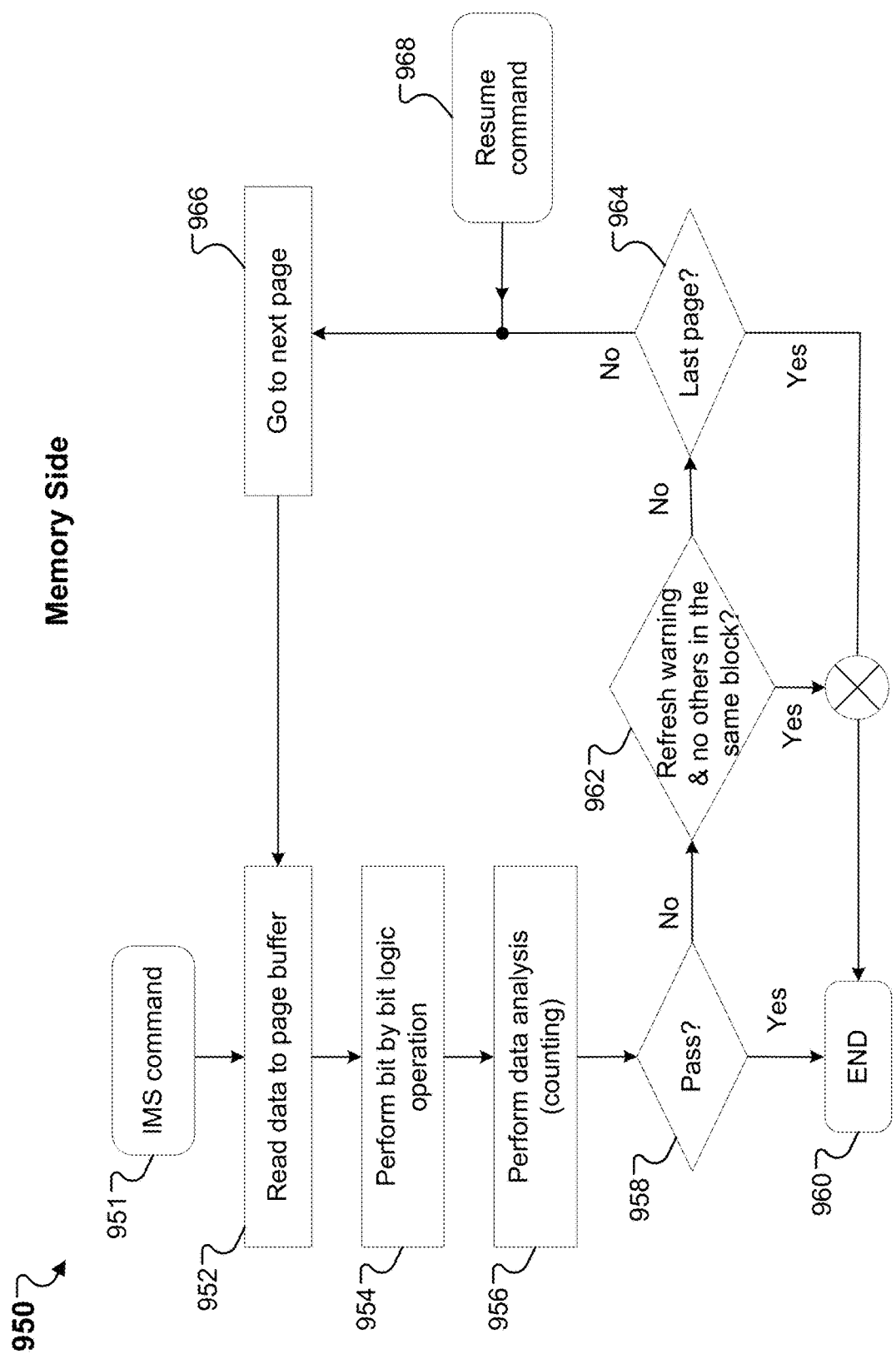

FIGS. 9A-9B are flow charts showing example processes 900, 950 of managing data refresh in a memory coupled to a controller, including a controller side (FIG. 9A) and a memory side (FIG. 9B), according to one or more implementations of the present disclosure. The memory can be the memory 116 of FIG. 1 or the memory 300 of FIG. 3. The controller can be the device controller 112 of FIG. 1 or the host controller 122 of FIG. 1. The process 900 can be performed by the controller, and the process 950 can be performed by the memory. The memory can be a CIM type memory, e.g., an IMS type memory. For illustration, the memory is described as an IMS memory that can perform an in-memory search (IMS) operation.

Figure 10:
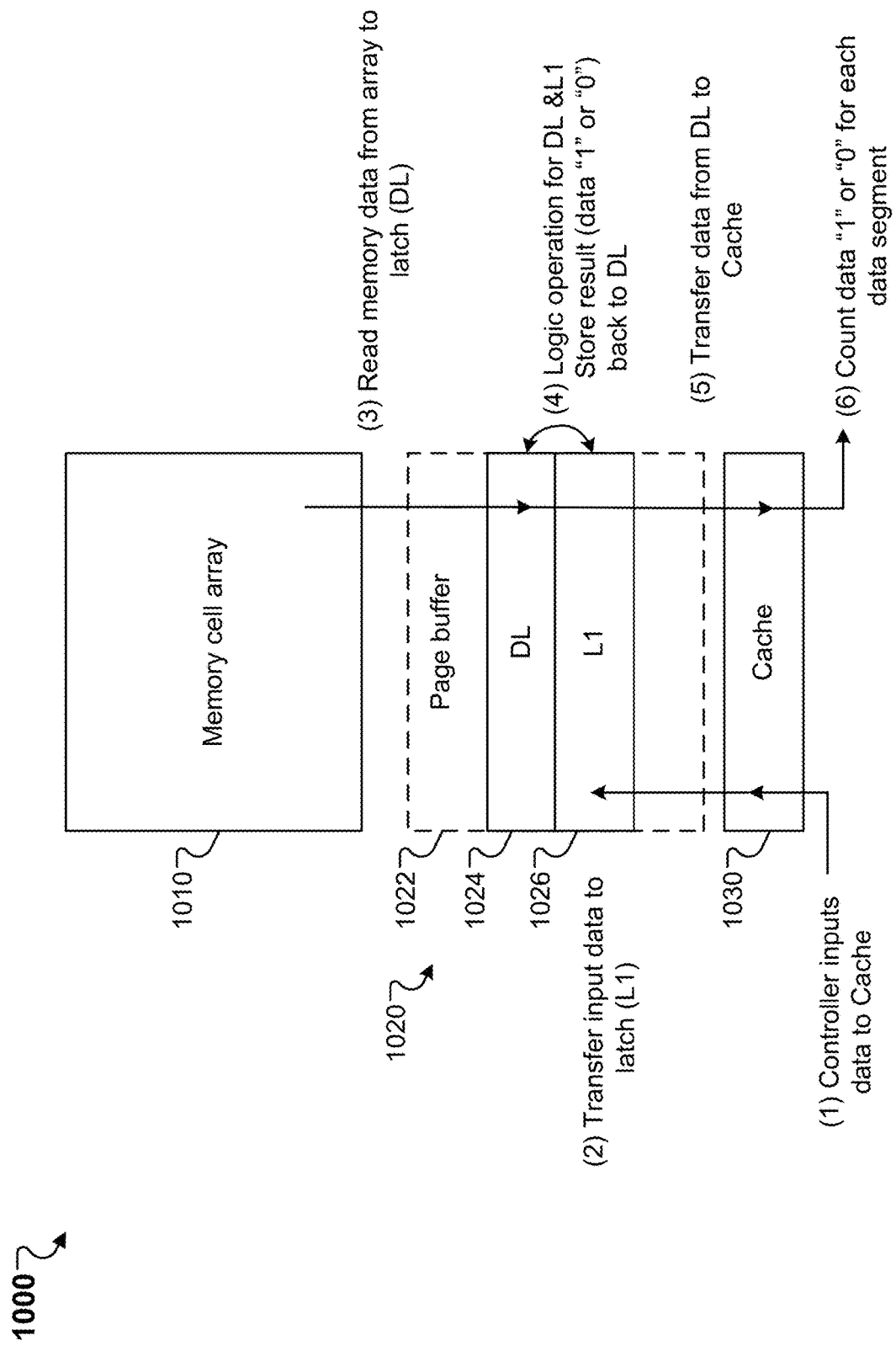
FIG. 10 shows an example process of managing data refresh in a memory, according to one or more implementations of the present disclosure.

FIG. 10 is a diagram illustrating an example 1000 of performing the processes 900, 950 of FIGS. 9A-9B in the memory. As illustrated in FIG. 10, the memory includes a memory cell array 1010 (e.g., the memory cell array 310 of FIG. 3), a page buffer circuit 1020 (e.g., the page buffer circuit 320 of FIG. 3), and a cache circuit 1030 (e.g., the cache data latch circuit 330 of FIG. 3). The page buffer circuit 1020 can include a number of page buffers 1022 (e.g., the page buffers 322 of FIG. 3). Each page buffer 1022 can include multiple latches including a first latch 1024 (represented by "DL") and a second latch 1026 (represented by "L1"). Each page buffer 1022 can also include logic (e.g., logic gates) for performing a logic operation between data stored in the first latch 1024 and data stored in the second latch 1026.

Referring to FIG. 9A, the process 900 starts at step 901. The controller then issues an IMS command to the memory to start the operation (step 902). After that, the memory becomes busy, and the controller keeps polling (or monitoring) a ready/busy status of the memory until the memory returns to a ready status (step 904).

In some embodiments, the controller receives a command from a user to perform a data search operation in the memory. In response to receiving the command, the controller can issue the IMS command to the memory. The IMS command can be matching memory data stored in the memory with input data. For example, the input data can be an image of the user, and the IMS command can search a previously stored image, e.g., for authentication of the user. The IMS command can include a search (or matching) threshold, e.g., 70%. The IMS command can also include a search range, e.g., a starting address and/or an end address in the memory. The search range can correspond to one or more pages in one or more blocks in the memory. That is, the IMS command can search data stored in the corresponding one or more pages. Accordingly, data refresh detection can be performed on the corresponding one or more pages or blocks.

Referring to FIG. 9B, the process 950 starts when the memory receives the IMS command from the controller (step 951). As illustrated in FIG. 10, the controller can input data to the cache circuit 1030 and the input data can be then transferred, e.g., bit by bit, to the second latch 1026 ("L1") for logic operation.

At step 952, the memory reads memory data from a page of a block to a page buffer. The memory data can include main data for matching with input data and also specific data for data refresh detection. The memory can store the memory data, e.g., bit by bit, into the first latch 1024 ("DL") in the same page buffer as the second latch 1026.

At step 954, the memory performs a bit by bit logic operation on the memory data in the first latch 1024 and the input data in the second latch 1026 to obtain a logic operation result. For example, the memory can perform an AND logic operation, e.g., as shown in FIG. 8B. If the memory data and the input data match, the logic operation result is "1". If the memory data and the input data do not match, the logic operation result is "0". After the logic operation, the memory can store the logic operation result back to the first latch 1024, e.g., as illustrated in FIG. 10. The logic operation result can then be transferred from the first latch 1024 to the cache circuit 1030 that can send the logic operation result to a counting circuit (e.g., the counting circuit 314 of FIG. 3).

At step 956, the memory performs data analysis on logic operation results for a data segment, e.g., a page. For example, the counting circuit can count a number of bits with a value (e.g., "1" or "0") for the page. As the page includes main data and specific data, e.g., as shown in FIG. 4, the logic operation results can include first results for the main data and second results for the specific data. Accordingly, the memory can obtain a first number of bits with a specific value (e.g., "1") for the main data and a second number of bits with the specific value (e.g., "1") for the specific data.

At step 958, the memory determines whether the first number of bits having the specific value for the main data passes a search threshold. The search threshold can be set by the controller, e.g., 70% of a total number of bits having the specific value in the main data. If the memory determines that the first number of bits having the specific value for the main data passes the search threshold, e.g., greater than the search threshold, the process 950 ends at step 960, and the memory returns to a ready status, which can be detected by the controller at step 904. The memory can also send a pass result (e.g., pass data information) to the controller.

If the memory determines that the first number of bits having the specific value for the main data fails to pass the search threshold, e.g., smaller than the search threshold, the memory determines whether a data refresh warning message is generated for the page. The memory can determine whether the second number of bits having a specific value (e.g., "1") for the specific data of the page satisfies a data refresh criterion, e.g., as illustrated in FIG. 5. If the second number of bits satisfies the data refresh criterion, e.g., within the data refresh criterion defined by a lower data count threshold and a higher data count threshold, the memory determines not to generate a data refresh warning message for the page. If the second number of bits fails to satisfy the data refresh criterion, e.g., outside of the data refresh criterion, the memory generates a data refresh warning message for the page or the block.

A block can be refreshed if a data refresh warning message is generated for at least one page in the block, e.g., any page in the block. In some cases, once a data refresh warning message is generated for a page in the block, the memory sends the data refresh warning message for the page or the block to the controller. In some cases, the memory sends a first data refresh warning message for a first page in the block to the controller, and disregards any future data refresh warning message in the same block, which can improve a performance of the memory and/or the controller, without dealing with extra data refresh warning messages for the same block.

As shown in FIG. 9B, at step 962, besides the data refresh warning message for a current page, the memory determines whether there is no other data refresh warning message generated for at least one other page in the same block. If there is no other data refresh warning message generated for the at least one other page in the same block, the memory ends the process 950 at step 960 and returns to the ready status. The memory can also send the data refresh warning message and information of the page or the block (e.g., a page address or a block address) to the controller.

If there is at least one other data refresh warning message generated for at least one other page in the same block, the memory proceeds to determine whether the current page is the last page for the IMS command. If the current page is the last page for the IMS command, the process 950 ends at step 960. The memory can send a message to the controller, and the message can indicate a completion of the IMS command. If the current page is not the last page for the IMS command, the memory proceeds to process a next page (step 966) for operation starting from step 952. If the memory receives a resume command from the controller (step 968), the process 950 can also proceed to step 966.

Referring back to FIG. 9A, once the controller determines the memory returns to a ready status (at step 904), the controller determines whether the current page passes the search threshold (step 906), for example, based on a result sent by the memory. If the current page passes the search threshold, the controller can get pass data information and perform a corresponding operation (step 908), e.g., authentication. If the current page fails to pass the search threshold, the memory determines whether there is a data refresh warning message generated for the block (step 910). If there is a data refresh warning message generated for the block, the controller records the block for data refresh (step 912). If there is no data refresh warning message generated for the block, the controller determines whether the current page is the last page for the IMS command (step 914). If the current page is the last page for the IMS command, the process 900 ends at step 916. If the current page is not the last page for the IMS command, the controller issues a resume command to the memory to start the operation again (step 918), and then monitor ready/busy status of the memory (step 904).

Figure 11:
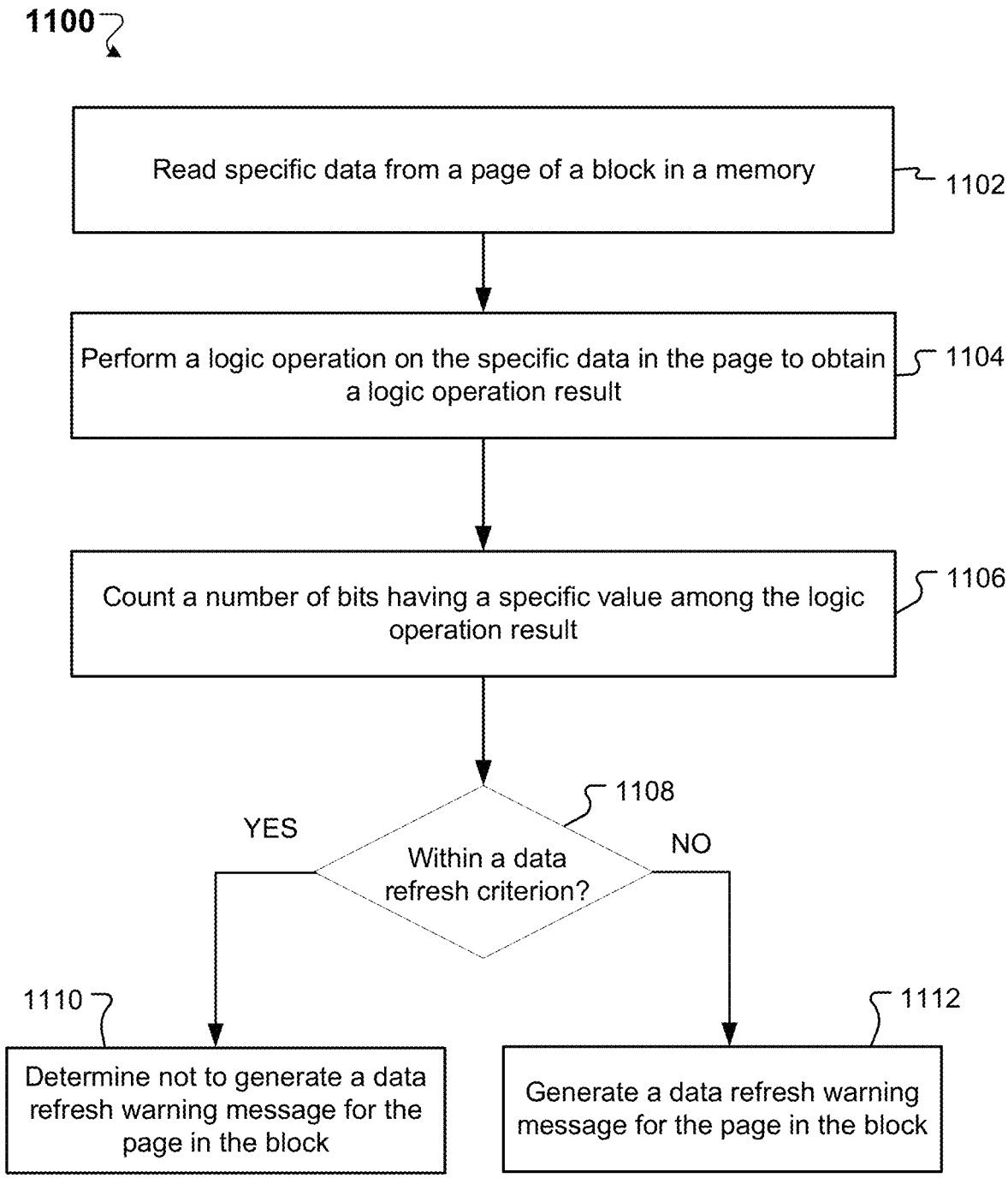
FIG. 11 is a flow chart showing an example process of managing data refresh in a semiconductor device, according to one or more implementations of the present disclosure.

FIG. 11 is a flow chart showing an example process 1100 of managing data refresh in a semiconductor device, according to one or more implementations of the present disclosure. The semiconductor device can be a memory. For illustration, a memory is described herein as an example of the semiconductor device. The memory can be the memory 116 of FIG. 1 or the memory 300 of FIG. 3. The memory can be coupled to a controller. The controller can be the device controller 112 of FIG. 1 or the host controller 122 of FIG. 1. The process 1100 can be performed by the memory.

The memory includes a plurality of blocks, and each block includes multiple pages. For data refresh detection, at least one page, e.g., each page or each programmed page, in a block stores specific data in a specific (or reserved) data area in the page, e.g., as illustrated in FIG. 4. The specific data area can be included in a spare data area (e.g., 420 of FIG. 4) or an additional data area (e.g., 430 of FIG. 4) in the page. The specific data can be stored in the page, together with main data, through a write operation, e.g., by the memory (as illustrated in FIG. 6A) or by the controller (as illustrated in FIG. 6B).

The controller can send an operation command (e.g., a CIM command such as an IMS command) to the memory. The operation command corresponds to one or more pages in the memory. For example, the operation command can include at least one of a starting address or an ending address in the memory. The operation command can also include input data for comparing memory data stored in the one or more pages. The input data can include first data for the operation command and second data for the data refresh detection or determination. The operation command can also include a predetermined threshold for the first data in the operation command and the main data stored in the page.

At step 1102, the memory reads specific data stored in a page of a block. For example, as illustrated in FIG. 9B or 10, in response to receiving the operation command from the controller, the memory reads the specific data in the page, e.g., bit by bit into a page buffer.

At step 1104, the memory performs a logic operation on the specific data in the page to obtain a logic operation result. The memory can transfer the input data from the controller, e.g., bit by bit, to the same page buffer as the specific data read from the page. Then the memory, e.g., the page buffer, can perform the logic operation on the specific data and the input data for the specific data to obtain the logic operation result, e.g., as illustrated in FIG. 8A or 10. The controller can store the logic operation for the operation command, e.g., in a configuration register such as 312 of FIG. 3. The logic operation can include at least one of AND, NAND, OR, NOR, XOR, or XNOR, as illustrated in FIG. 8B. The input data corresponding to the logic operation can include a series of "1" or a series of "0" for performing the data refresh determination on the specific data.

At step 1106, the memory counts a number of bits having a specific value among the logic operation result. The specific data can have a data pattern, e.g., 70% data with "1" and 30% data with "0". The specific value can be "1" or "0" based on the logic operation, e.g., as illustrated in FIG. 8B. The memory can include a counting circuit, e.g., 314 of FIG. 3, configured to count the number of bits having the specific value among the logic operation result. In some embodiments, the memory sends the number of bits having the specific value for the page to the controller, and the controller can make data refresh detection or determination for the page or the block based on the number of bits having the specific value.

At step 1108, the memory determines whether the number of bits is within a data refresh criterion for the page. The memory can store a data refresh criterion (e.g., as illustrated in FIG. 5) for the page include a configuration register, e.g., 312 of FIG. 3. In some cases, the data refresh criterion is fixed for each page. In some cases, the configuration register can store different data refresh criterions for different pages, e.g., as illustrated in FIG. 7C. The controller can determine the different data refresh criterions based on different applications.

In response to determining that the number of bits is within the data refresh criterion, at step 1110, the memory determines not to generate a data refresh warning message for the page in the block. In response to determining that the number of bits is outside of the data refresh criterion, at step 1112, the memory generates a data refresh warning message for the page in the block. The data refresh criterion can include a data refresh range from a lower data count threshold to a higher data count threshold. The number of bits is outside of the data refresh criterion if the number of bits is smaller than the lower data count threshold or greater than the higher data count threshold, and the number of bits is within the data refresh criterion if the number of bits is no smaller than the lower data count threshold and no greater than the higher data count threshold.

In some embodiments, the memory is configured to: determine whether there is at least one other data refresh warning message generated for at least one other page in the corresponding block. In response to determining that there is no other data refresh warning message generated for the at least one other page in the corresponding block, the memory can send the data refresh warning message and information associated with the page or the corresponding block (e.g., a page address or a block address) to the controller.

In some embodiments, the memory is configured to: in response to determining that there is at least one data refresh warning message generated for the at least one page in the corresponding block, disregard the data refresh warning message generated for the corresponding block.

In some embodiments, the controller is configured to: in response to receiving the data refresh warning message and the information associated with the corresponding block from the memory, record the corresponding block for data refresh, e.g., as illustrated step 912 in FIG. 9A.

In some embodiments, the controller is configured to perform the data refresh for the corresponding block by copying data in the corresponding block to a buffer block, recovering the copied data in the buffer block using an ECC scheme, and erasing the corresponding block and writing back the recovered data to the erased corresponding block.

In some embodiments, as illustrated in FIG. 9B, the memory is further configured to: in response to determining at least one of (i) the number of bits is within the data refresh criterion or (ii) there is at least one other data refresh warning message generated for at least one other page in the corresponding block, determine whether the page is a last page of the one or more pages corresponding to the operation command.

In some embodiments, the memory is further configured to: in response to determining that the page is the last page of the one or more pages corresponding the operation command, send a message to the controller, the message indicating a completion of the operation command, and in response to determining at least one of: (i) there is a second page following the page in the one or more pages or (ii) there is a resume command received from the controller, continue to read data stored in the second page for further operation. The controller can be configured to: in response to determining that the page is not the last page in the one or more pages, send the resume command to the memory.

In some embodiments, as illustrated in FIGS. 7A-7B, a block includes a plurality of pages that are associated with a same word line and include memory cells having a series of states. Among the series of states, data programmed in a first state has an inclination to suffer from more data degradation than data programmed in a second state. The controller can be configured to program, for the plurality of pages, first specific data in the first state and second specific data in the second state, and the first specific data has a higher data distribution weight than the second specific data among specific data for the plurality of pages.

In some embodiments, as illustrated in FIG. 9B, the memory is configured to: read data from the page, the data including the specific data stored in a first area of the page and second data stored in a second, different area of the page, perform the logic operation on the second data to obtain a second logic operation result, count a second number of bits having a second specific value among the second logic operation result, and determine whether the second number of bits having the second specific value is no greater than a predetermined threshold (e.g., 30%) if the second specific value is "0" or determine whether the second number of bits having the second specific value is no less than a predetermined threshold (e.g., 70%) if the second specific value is "1".

In some embodiments, if the second specific value is "0", the memory is configured to: in response to determining that the second number of bits is no greater than the predetermined threshold (e.g., 30%), send pass data information for the page to the controller, and in response to determining that the second number of bits is greater than the predetermined threshold (e.g., 30%), determine whether there is a data refresh warning message generated for the page.

In some embodiments, if the second specific value is "1", the memory is configured to: in response to determining that the second number of bits is no less than the predetermined threshold (e.g., 70%), send pass data information for the page to the controller, and in response to determining that the second number of bits is less than the predetermined threshold (e.g., 70%), determine whether there is a data refresh warning message generated for the page.

In some embodiments, the controller is configured to: in response to receiving the pass data information from the memory, determine whether the page is a last page of the one or more pages corresponding to the operation command.

In some embodiments, as illustrated in FIG. 6A, the controller is configured to send a write command and the second data to the memory, and the memory is configured to write the second data in the second area and program the specific data in the first area of the page based on a predetermined configuration.

In some embodiments, as illustrated in FIG. 6B, the controller is configured to send a write command and the data including the second data and the specific data to the memory and the memory is configured to write the second data in the second area and the specific data in the first area of the page.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory, including by way of example semiconductor memory, e.g., EPROM, EEPROM, and flash memory; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A system comprising:
a memory comprising a plurality of blocks, each block comprising multiple pages; and
a controller coupled to the memory and configured to send an operation command to the memory, the operation command corresponding to one or more pages in the memory, the operation command comprising input data,
wherein the memory is configured to:
read memory data stored in a page of the one or more pages, the memory data comprising specific data stored in a first area of the page and second data stored in a second area of the page,
perform a logic operation on the memory data in the page and the input data in the operation command to obtain a logic operation result, and
count a first number of bits having a first specific value among the logic operation result for the specific data and a second number of bits having a second specific value among the logic operation result for the second data, the first number of bits being associated with data refresh determination for a corresponding block including the page, the second number of bits being associated with execution of the operation command on the page.

2. The system of claim 1, wherein the memory is configured to:
determine whether the first number of bits is within a data refresh criterion for the page, and
in response to determining that the first number of bits is outside of the data refresh criterion, generate a data refresh warning message for the page in the corresponding block.

3. The system of claim 2, wherein the memory is configured to:
determine whether there is at least one other data refresh warning message generated for at least one other page in the corresponding block; and
in response to determining that there is no other data refresh warning message generated for the at least one other page in the corresponding block, send the data refresh warning message and information associated with the corresponding block to the controller.

4. The system of claim 3, wherein the controller is configured to:
in response to receiving the data refresh warning message and the information associated with the corresponding block from the memory, record the corresponding block for data refresh.

5. The system of claim 2, wherein the memory is further configured to:
in response to determining at least one of: (i) the first number of bits is within the data refresh criterion or (ii) there is at least one other data refresh warning message generated for at least one other page in the corresponding block, determine whether the page is a last page of the one or more pages corresponding to the operation command.

6. The system of claim 5, wherein the memory is further configured to:
in response to determining that the page is the last page of the one or more pages corresponding the operation command, send a message to the controller, the message indicating a completion of the operation command, and
in response to determining at least one of: (i) there is a second page following the page in the one or more pages or (ii) there is a resume command received from the controller, continue to read data stored in the second page for further operation.

7. The system of claim 2, wherein the memory comprises a configuration register storing the data refresh criterion for the page, and
wherein the configuration register is configured to store respective data fresh criterions for different pages in the memory.

8. The system of claim 7, wherein a block comprises a plurality of pages that are associated with a same word line and include memory cells having a series of states, and among the series of states, data programmed in a first state has an inclination to suffer from more data degradation than data programmed in a second state, and
wherein the controller is configured to program, for the plurality of pages, first specific data in the first state and second specific data in the second state, and the first specific data has a higher data distribution weight than the second specific data among specific data for the plurality of pages.

9. The system of claim 1, wherein each programmed page in the memory stores corresponding specific data in the programmed page.

10. The system of claim 1, wherein the memory is configured to:
determine whether the second number of bits having the second specific value is no greater than a predetermined threshold.

11. The system of claim 10, wherein the memory is configured to:
in response to determining that the second number of bits is no greater than the predetermined threshold, send pass data information for the page to the controller, and
in response to determining that the second number of bits is greater than the predetermined threshold, determine whether there is a data refresh warning message generated for the page.

12. The system of claim 11, wherein the controller is configured to:
in response to receiving the pass data information from the memory, determine whether the page is a last page of the one or more pages corresponding to the operation command.

13. The system of claim 10, wherein the controller is configured to send a write command and the data including the second data and the specific data to the memory and
wherein the memory is configured to write the second data in the second area and the specific data in the first area of the page.

14. The system of claim 10, wherein the controller is configured to send a write command and the second data to the memory, and wherein the memory is configured to write the second data in the second area and program the specific data in the first area of the page based on a predetermined configuration.

15. The system of claim 1, wherein the memory is configured to send the first number of bits to the controller, and
wherein the controller is configured to: determine whether the first number of bits is within a data refresh criterion for the page, and in response to determining that the first number of bits is outside of the data refresh criterion, record the corresponding block for data refresh.

16. The system of claim 1, wherein the memory is configured to perform the logic operation on the specific data in the page and input data corresponding to the logic operation to obtain the logic operation result, and
wherein the logic operation comprises at least one of AND, NAND, OR, NOR, XOR, or XNOR, and the input data corresponding to the logic operation comprises a series of "1" or a series of "0" for performing the data refresh determination on the specific data.

17. A semiconductor device comprising:
a memory cell array having a plurality of blocks, each block comprising multiple pages; and
one or more integrated circuits coupled to the memory cell array and configured to:
read memory data from a page of a block in the memory cell array, the memory data comprising specific data stored in a first area of the page and second data stored in a second area of the page,
perform a logic operation on the memory data in the page and input data in an operation command to obtain a logic operation result,
count a first number of bits having a first specific value among the logic operation result for the specific data and a second number of bits having a second specific value among the logic operation result for the second data, the first number of bits being associated with data refresh determination for the block, the second number of bits being associated with execution of the operation command on the page,
determine whether the first number of bits is within a data refresh criterion for the page, and
in response to determining that the first number of bits is outside of the data refresh criterion, generate a data refresh warning message for the page in the block.

18. The semiconductor device of claim 17, wherein the one or more integrated circuits comprise at least one of a page buffer circuit, a cache circuit, or a counting circuit, and
wherein the semiconductor device further comprises a configuration register storing the data refresh criterion for the page, and the configuration register is configured to store respective data fresh criterions for different pages in the memory.

19. The semiconductor device of claim 17, wherein the one or more integrated circuits are configured to:
determine whether the second number of bits having the second specific value is no greater than a predetermined threshold, and
in response to determining that the second number of bits having the second specific value is greater than the predetermined threshold, determine whether the data refresh warning message is generated for the page.

20. A method comprising:
reading memory data from a page of a block in a memory, the memory data comprising specific data stored in a first area of the page and second data stored in a second area of the page;
performing a logic operation on the memory data in the page and input data in an operation command to obtain a logic operation result;
counting a first number of bits having a first specific value among the logic operation result for the specific data and a second number of bits having a second specific value among the logic operation result for the second data, the first number of bits being associated with data refresh determination for the block, the second number of bits being associated with execution of the operation command on the page;
determining whether the first number of bits is within a data refresh criterion for the page; and
in response to determining that the first number of bits is outside of the data refresh criterion, generating a data refresh warning message for the page in the block.

* * * * *